(12) United States Patent
Yamagata et al.

(10) Patent No.: US 11,467,099 B2
(45) Date of Patent: Oct. 11, 2022

(54) INSPECTION APPARATUS

(71) Applicant: TOKYO ELECTRON LIMITED, Tokyo (JP)

(72) Inventors: Kazumi Yamagata, Nirasaki (JP); Tatsuo Kawashima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 146 days.

(21) Appl. No.: 16/821,573

(22) Filed: Mar. 17, 2020

(65) Prior Publication Data

US 2020/0309717 A1 Oct. 1, 2020

(30) Foreign Application Priority Data

Mar. 26, 2019 (JP) .............................. JP2019-059209

(51) Int. Cl.
*G01R 31/28* (2006.01)
*G01N 21/95* (2006.01)

(52) U.S. Cl.
CPC ..... *G01N 21/9501* (2013.01); *G01R 31/2893* (2013.01)

(58) Field of Classification Search
CPC ...... G01N 21/9501; G01N 21/95; G01R 1/04; G01R 1/07307; G01R 31/2863; G01R 31/2865; G01R 31/2887; G01R 31/2889; G01R 31/2893; G01R 31/28

USPC ....................................................... 324/750.1
See application file for complete search history.

(56) References Cited

U.S. PATENT DOCUMENTS

2010/0079161 A1* 4/2010 Endo .................. G01R 31/2887
324/754.12
2016/0069951 A1* 3/2016 Yamada ............. G01R 31/2891
324/750.2

FOREIGN PATENT DOCUMENTS

JP 2016-58506 A 4/2016
KR 1020070003232 A 1/2007
KR 1020100033938 A 3/2010

* cited by examiner

*Primary Examiner* — Jermele M Hollington
*Assistant Examiner* — Courtney G McDonnough
(74) *Attorney, Agent, or Firm* — Nath, Goldberg & Meyer; Jerald L. Meyer; Tanya E. Harkins (57) ABSTRACT

There is provided an inspection apparatus, including: a housing having an upper surface on which an interface part for electrical connection with a probe card is provided; a first frame configured to be movable to a connection position where the first frame covers an upper portion of the interface part and to a retraction position where the first frame is retracted from the upper portion of the interface part; and a second frame configured to support a test head, arranged inside the first frame, and held by the first frame so as to be switchable between a fixed state in which the second frame is fixed to the first frame and a movable state in which the second frame is movable at least in a direction parallel to the interface part at the connection position.

4 Claims, 9 Drawing Sheets

INSPECTION APPARATUS

CROSS-REFERENCE TO RELATED APPLICATION

This application is based upon and claims the benefit of priority from Japanese Patent Application No. 2019-059209, filed on Mar. 26, 2019, the entire contents of which are incorporated herein by reference.

TECHNICAL FIELD

The present disclosure relates to an inspection apparatus.

BACKGROUND

Patent Document 1 discloses an inspection apparatus including a suction mechanism that connects a test head connected to a tester for inspecting a state of a semiconductor device to a pogo frame by vacuum suction.

PRIOR ART DOCUMENT

[Patent Document]
Patent Document 1: Japanese Laid-Open Patent Publication No. 2016-058506

SUMMARY

According to one embodiment of the present disclosure, there is provided an inspection apparatus, including: a housing having an upper surface on which an interface part for electrical connection with a probe card is provided; a first frame configured to be movable to a connection position where the first frame covers an upper portion of the interface part and to a retraction position where the first frame is retracted from the upper portion of the interface part; and a second frame configured to support a test head, arranged inside the first frame, and held by the first frame so as to be switchable between a fixed state in which the second frame is fixed to the first frame and a movable state in which the second frame is movable at least in a direction parallel to the interface part at the connection position.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, an embodiment of an inspection apparatus disclosed in the present application will be described in detail with reference to the accompanying drawings. The inspection apparatus disclosed herein is not limited by the present embodiment. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, an inspection apparatus such as a prober or the like is used for electrical inspection of a semiconductor device formed on a semiconductor wafer. The inspection apparatus performs inspection by driving a wafer chuck on which the semiconductor wafer to be inspected is arranged, and bringing electrode pads on the semiconductor wafer into contact with probes of a probe card.

There is available an inspection apparatus in which a test head is connected by vacuum suction to an interface part such as a pogo frame or the like for electrical connection with a probe card. In order to connect the test head to the interface part by vacuum suction, the parallelism between the interface part and the test head is important.

Incidentally, there is known an inspection apparatus having a configuration in which a test head is rotated between a connection position where the test head is connected to an interface part and a retraction position where the test head is retracted from the interface part. When the test head is rotated, the test head may be inclined with respect to the interface part, and the test head may not be properly connected to the interface part. Therefore, there has been an expectation that the test head can be stably connected to the interface part.

Figure 1:
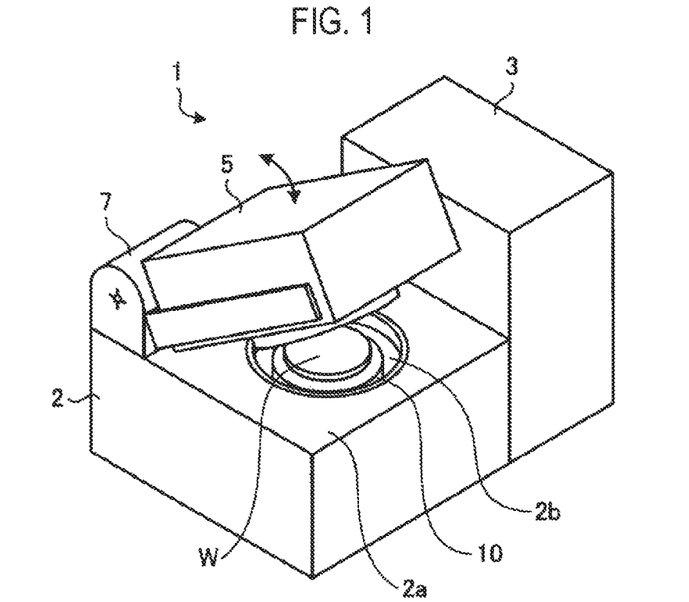
FIG. 1 is a perspective view showing an example of an external configuration of an inspection apparatus according to an embodiment.

[Configuration of Inspection Apparatus]
First, a configuration of an inspection apparatus that inspects a semiconductor device will be described. FIG. 1 is a perspective view showing an example of an external configuration of an inspection apparatus 1 according to an embodiment.

The inspection apparatus 1 according to the present embodiment performs inspection of electrical characteristics of a device (not shown) such as a semiconductor device or the like formed on a substrate (hereinafter also simply referred to as "wafer") W such as a semiconductor wafer or a resin substrate. The inspection apparatus 1 includes a main body housing 2, a loader part 3 disposed adjacent to the main body housing 2, and a test head housing 5.

The main body housing 2 has a hollow internal space and accommodates a wafer chuck 10 for mounting the wafer W to be inspected. An opening portion 2b is formed in a ceiling portion 2a of the main body housing 2. The opening portion 2b is located above the wafer chuck 10. A substantially disk-shaped insert ring (not shown) that holds a disk-shaped probe card (not shown) having a large number of probe needles is engaged with the opening portion 2b. By the insert ring, the probe card is arranged to face the wafer W mounted on the wafer chuck 10. Details around the insert ring will be described later.

The loader part 3 takes out the wafer W accommodated in a FOUP (not shown), which is a transfer container, and transfers the wafer W to the wafer chuck 10 of the main body housing 2. Furthermore, the loader part 3 receives, from the wafer chuck 10, the wafer W for which the inspection of the electrical characteristics of the devices has been completed, and accommodate the same in the FOUP.

The test head housing 5 has a rectangular parallelepiped shape. A test head described later is disposed inside the test head housing 5. The test head housing 5 is configured to be rotatable (movable) upward by a hinge mechanism 7 provided in the main body housing 2. When the test head housing 5 covers the main body housing 2 from above, the test head disposed inside the test head housing 5 is electrically connected to the probe card via the interface part.

Figure 2:
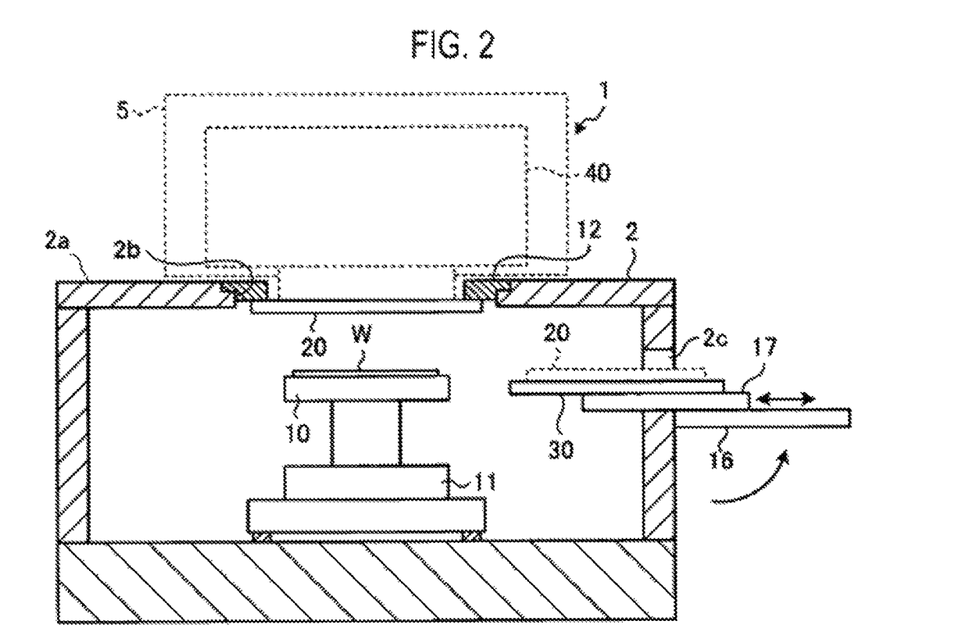
FIG. 2 is a vertical cross-sectional view showing an example of a schematic configuration of the inspection apparatus according to the embodiment.

Next, the internal configuration of the inspection apparatus 1 will be described. FIG. 2 is a vertical cross-sectional view showing an example of a schematic configuration of the inspection apparatus 1 according to the embodiment. The wafer chuck 10 is provided inside the main body housing 2 of the inspection apparatus 1. The wafer chuck 10 includes a drive mechanism 11 and is movable in x, y, z and θ directions.

The opening portion 2b of the main body housing 2 is located above the wafer chuck 10. An insert ring 12 is provided along the periphery of the opening portion 2b. The probe card 20 is detachably attached to the insert ring 12. A detailed configuration near the insert ring 12 will be described later.

The probe card 20 includes a wiring board, a plurality of probes (not shown) electrically connected to the wiring board, and the like. The probes of the probe card 20 are provided to correspond to the electrodes of the semiconductor device formed on the wafer W.

The test head housing 5 is rotatable toward the upper side of the main body housing 2 by the hinge mechanism 7 shown in FIG. 1, as indicated by a dot line in FIG. 2. A test head 40 is arranged inside the test head housing 5. The test head 40 is disposed above the probe card 20 by rotating the test head housing 5 toward the upper side of the main body housing 2. The test head 40 is connected to a tester that sends an inspection signal and detects a signal from each semiconductor device to inspect the state of each semiconductor device.

When the electrical inspection of the semiconductor device formed on the wafer W is performed using the inspection apparatus 1, the wafer W having the semiconductor device formed thereon is placed on the wafer chuck 10. The inspection apparatus 1 raises the wafer chuck 10, on which the wafer W is placed, to a position corresponding to the probe card 20 by the drive mechanism 11. Then, the inspection apparatus 1 brings the respective electrodes of the semiconductor device formed on the wafer W into contact with the corresponding probes of the probe card 20, thereby electrically connecting the semiconductor device to the probe card 20. In the inspection apparatus 1, the tester sends an inspection signal to the semiconductor device via the test head 40 and the probe card 20, and detects a signal from the semiconductor device to inspect the state of the semiconductor device.

A loading/unloading port 2c for loading and unloading the probe card 20 into and from the main body housing 2 therethrough is provided at one sidewall portion of the main body housing 2, namely a sidewall portion on a front side (right side in FIG. 2) in the present embodiment. Furthermore, an arm 16 constituting a probe card replacement mechanism is provided below the loading/unloading port 2c. The arm 16 is rotatable up and down about a support shaft provided on a wall surface portion of the main body housing 2 as indicated by an arrow in FIG. 2. FIG. 2 shows a state in which the arm 16 is rotated upward (flipped up) and fixed.

As shown by an arrow in FIG. 2, a slide mechanism 17 capable of moving in a parallel direction is provided on the arm 16. The slide mechanism 17 has a bifurcated fork-shaped portion on a distal end side (left side in FIG. 2) thereof, and can support a transfer device 30 at the fork-shaped portion on the distal end side. The transfer device 30 is capable of placing the probe card 20 on an upper surface thereof. When loading and unloading the probe card 20, the transfer device 30 transfers the probe card 20 by mounting the probe card 20 thereon.

The slide mechanism 17 loads the transfer device 30, on which the probe card 20 is placed, from the loading/unloading port 2c to a delivery position defined inside the main body housing 2. The transfer device 30 is moved up by the drive mechanism of the arm 16 to a probe card attaching position near the lower surface of the insert ring 12, and the probe card 20 on the transfer device 30 is fixed to the insert ring 12.

Figure 3:
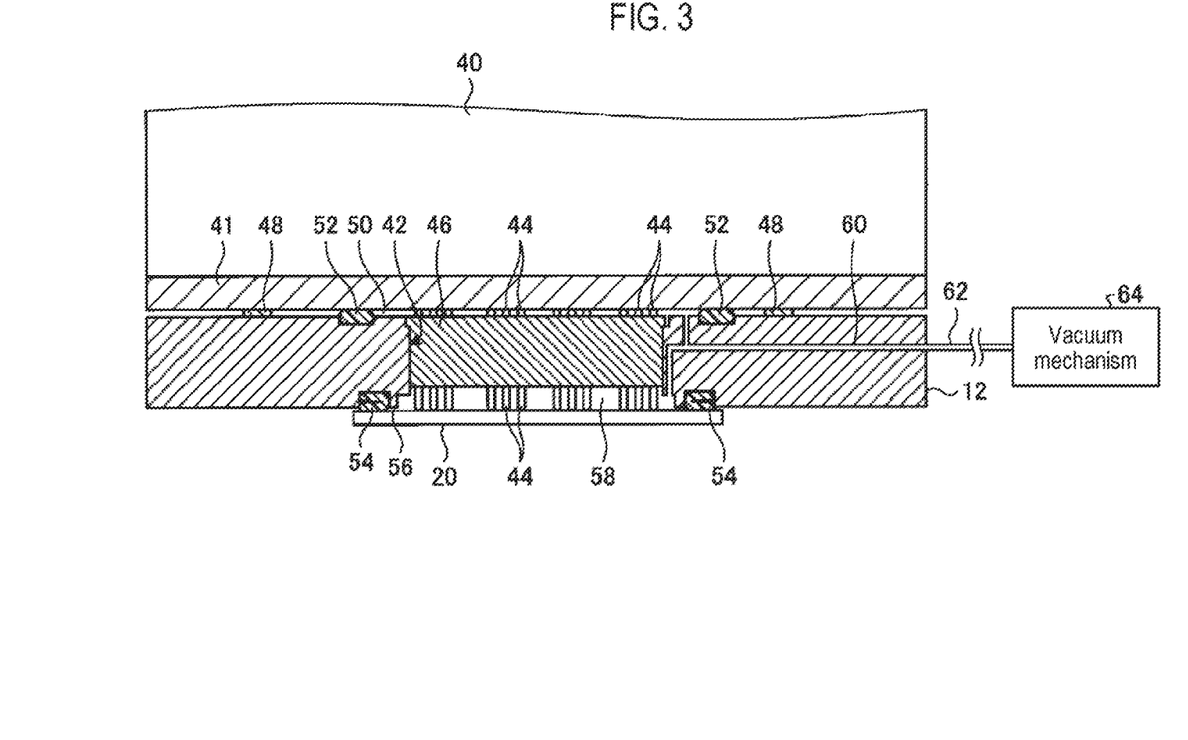
FIG. 3 is a view showing an example of a configuration near an insert ring in the inspection apparatus according to the embodiment.

FIG. 3 is a view showing an example of the configuration near the insert ring 12 of the inspection apparatus 1 according to the embodiment. At the center of the insert ring 12, a pogo block mounting hole 42 having a diameter slightly smaller than that of the probe card 20 is formed. A substantially cylindrical pogo block 46 for holding a large number of pogo pins 44 is removably inserted into the pogo block mounting hole 42. In the present embodiment, the insert ring 12 and the pogo block 46 correspond to the interface part.

A large number of probes are attached to the probe card 20 in a predetermined arrangement pattern. The distal ends of the probes protrude from the lower surface of the probe card 20 and are arranged to face the respective electrode pads provided on the semiconductor device formed on the wafer W mounted on the wafer chuck 10.

The test head 40 includes a motherboard 41 provided on the lower surface thereof facing the insert ring 12. The motherboard 41 is provided with electrodes corresponding to the respective pogo pins 44. A gap 50 is formed between the insert ring 12 and the motherboard 41 via an annular spacer 48. The gap 50 is radially divided by an annular sealing member 52 disposed around a pogo block mounting area. Furthermore, between the insert ring 12 and the probe card 20, a gap 56 between the insert ring 12 and the probe card 20 is radially divided by an annular seal member 54 arranged around the pogo block mounting area. Thus, a sealable suction space 58 surrounded by the motherboard 41, the probe card 20 and the seal members 52 and 54 is formed.

The suction space 58 is connected to a probe-card-holding vacuum mechanism 64 via a gas flow path 60 formed around the insert ring 12 and an external pipe 62. The vacuum mechanism 64 has a vacuum source such as a vacuum pump or the like. The vacuum mechanism 64 reduces an internal pressure of the suction space 58 to a predetermined negative pressure, and constantly maintains such a reduced pressure state. Thus, the distal ends (lower ends) of the pogo pins 44 are elastically pressed against and brought into contact with the respective electrodes on the upper surface of the probe card 20 by virtue of the vacuum suction force acting on the probe card 20 and the insert ring 12. Furthermore, the top portions (upper ends) of the pogo pins 44 are pressed against the respective electrodes of the motherboard 41. Moreover, the probe card 20 located at the probe card mounting position receives an upwardly-biased force caused by a pressure difference between the internal pressure (negative pressure) of the suction space 58 and the ambient pressure, whereby the probe card 20 is attracted and fixed to the insert ring 12. The inspection apparatus 1 can bring the test head 40 and the probe card 20 into contact with the insert ring 12 and the pogo block 46 with an appropriate pressure by adjusting the pressure to be reduced by the vacuum mechanism 64.

Incidentally, in the inspection apparatus 1 according to the present embodiment, the test head housing 5 accommodating the test head 40 is rotatable upward with respect to the main body housing 2. For this reason, in the inspection apparatus 1, the test head 40 may be inclined with respect to the insert ring 12, and the test head 40 may not be able to be properly vacuum-sucked toward the insert ring 12. Therefore, the inspection apparatus 1 according to the present embodiment is configured to be switchable between a fixed state in which the test head 40 is fixed inside the test head housing 5 and a movable state in which the test head 40 is slightly movable.

Figure 4:
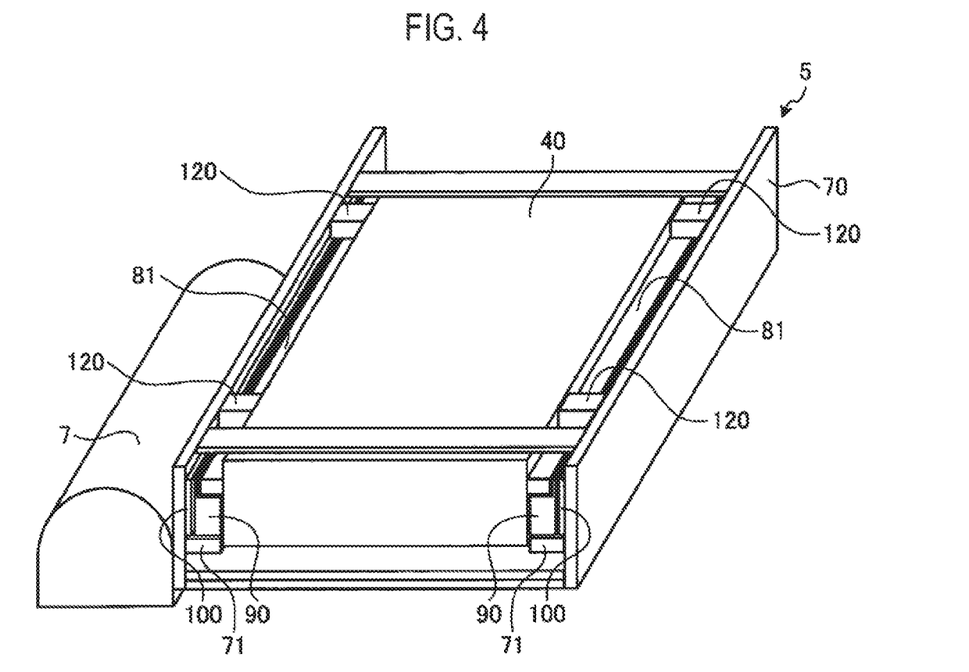
FIG. 4 is a perspective view showing an example of an internal configuration of a test head housing according to the embodiment.

FIG. 4 is a perspective view showing an example of the internal configuration of the test head housing 5 according to the embodiment. The test head housing 5 includes a first frame 70, the test head 40, second frames 90 and slide rails 100.

The first frame 70 is formed in a rectangular box shape, and is rotatable by a hinge mechanism 7 between a connection position where the first frame 70 covers the upper portion of the insert ring 12 and a retraction position where the first frame 70 is retracted from the upper portion of the insert ring 12. The first frame 70 accommodates the test head 40 therein.

The test head 40 is formed in a rectangular box shape smaller than that of the first frame 70, and is arranged inside the first frame 70.

Figure 5:
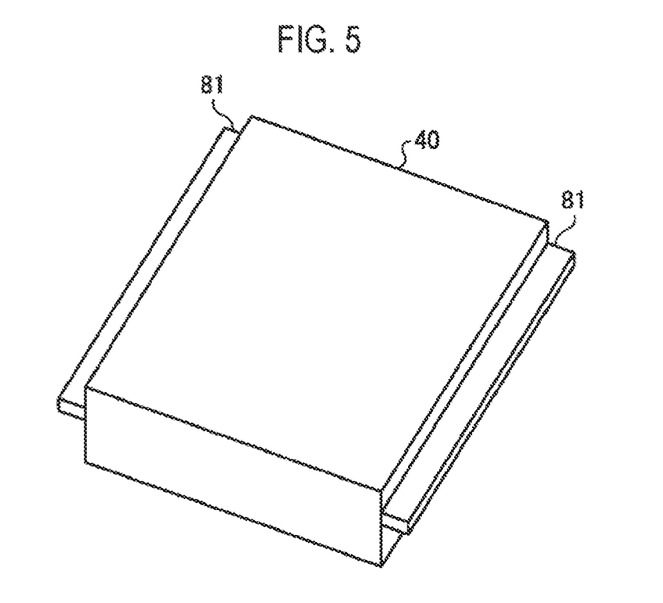
FIG. 5 is a perspective view showing an example of a configuration of a test head according to the embodiment.

FIG. 5 is a perspective view showing an example of the configuration of the test head 40 according to the embodiment. The test head 40 is provided with elongated support rails 81 formed so as to protrude from two opposing side surfaces.

As shown in FIG. 4, the second frames 90 and the slide rails 100 are provided side by side between the first frame 70 and the two side surfaces of the test head 40 where the support rails 81 are provided.

Figure 6:
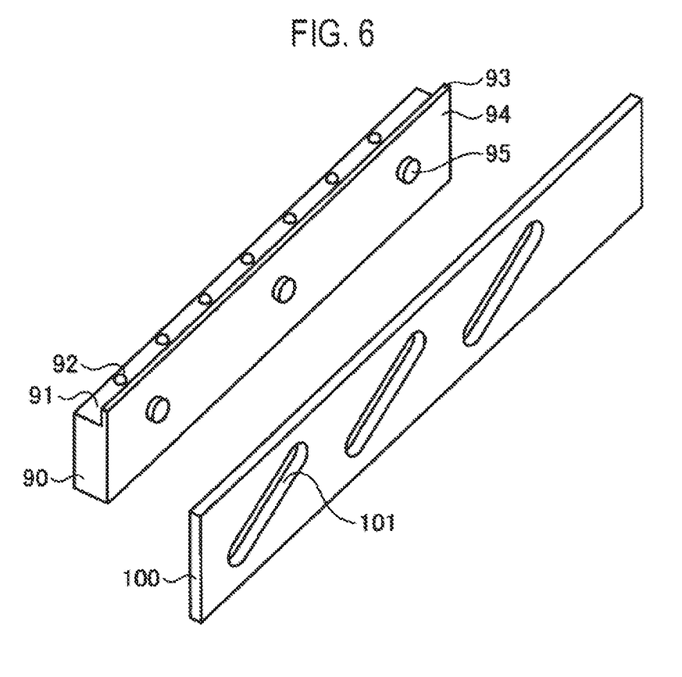
FIG. 6 is a perspective view showing an example of a configuration of a second frame and a slide rail according to the embodiment.

FIG. 6 is a perspective view showing an example of the configuration of the second frame 90 and the slide rail 100 according to the embodiment. The second frame 90 has an elongated plate shape with a rectangular cross section. A plurality of hemispherical balls 92 is arranged on an upper surface 91 of the second frame 90 at predetermined intervals. Furthermore, the second frame 90 has a thin flange portion 93 protruding from the upper surface 91 at the side facing the slide rail 100. The second frame 90 has a plurality of circular cam followers 95 arranged on a side surface 94 facing the slide rail 100.

The slide rail 100 has an elongated plate shape with a rectangular cross section. The slide rail 100 has through-holes 101 formed in a corresponding relationship with the positions of the cam followers 95 of the second frame 90. The through-holes 101 have a width corresponding to the diameter of the cam followers 95. The through-holes 101 are formed in an elongated shape obliquely at a predetermined angle with respect to the vertical direction.

As shown in FIG. 4, the first frame 70 is provided with elongated support rails 71 protruding from an inner surface facing the slide rail 100. The slide rail 100 and the second frame 90 are arranged side by side above the support rail 71 with the cam followers 95 inserted into the respective through-holes 101.

The test head 40 is arranged such that the support rail 81 engages with the upper surface 91 of the second frame 90. The test head 40 is supported by the second frame 90 via the plurality of balls 92 provided on the upper surface 91. The test head 40 can be moved in the horizontal direction because the support rail 81 is supported by the plurality of balls 92. The flange portion 93 prevents the support rail 81 from excessively moving toward the slide rail 100 and dropping off the upper surface 91.

Figure 7A:
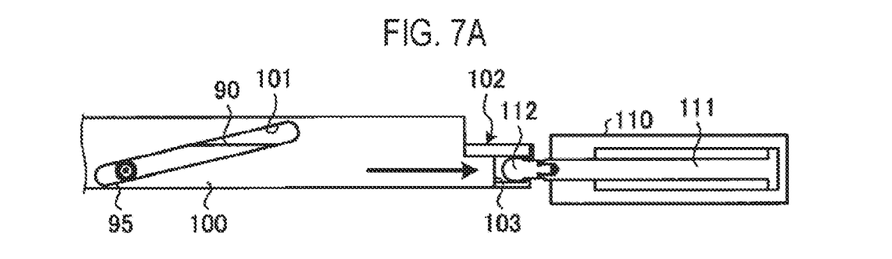
FIG. 7A is a view showing an example of a configuration near the slide rail according to the embodiment.
Figure 7B:
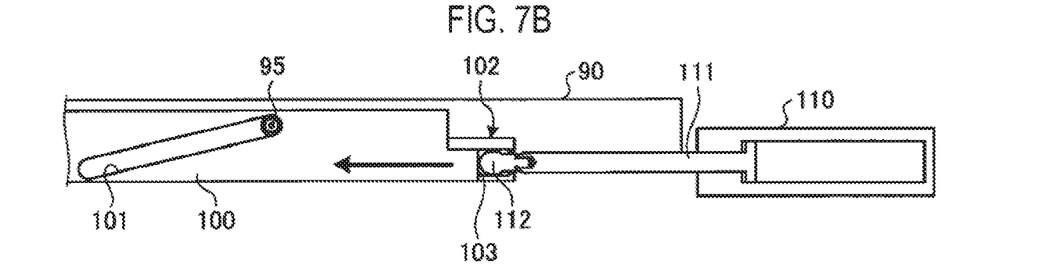
FIG. 7B is a view showing an example of a configuration near the slide rail according to the embodiment.

The slide rail 100 is slidable by sliding on the support rail 71. FIGS. 7A and 7B are views showing an example of the configuration near the slide rail 100 according to the embodiment. A cylinder 110 is provided at one end of the slide rail 100. The cylinder 110 is provided with an extendable rod 111. On a distal end of the rod 111, a hemispherical head 112 is provided.

Figure 8:
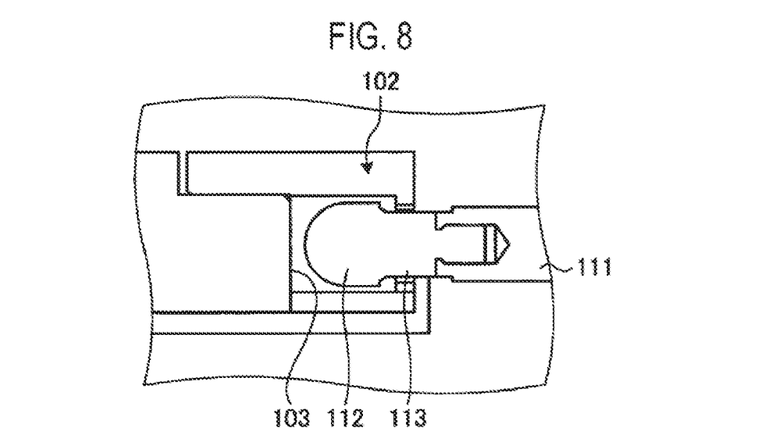
FIG. 8 is a view showing an example of a detailed configuration near a head according to the embodiment.

FIG. 8 is a view showing an example of a detailed configuration near the head 112 according to the embodiment. The head 112 is formed such that an end portion 113 on the side of the rod 111 is smaller in diameter than an end portion on the hemispherical distal end side.

The slide rail 100 has a connection portion 102 connected to the head 112. A concave portion 103 opened toward the cylinder 110 is formed in the connection portion 102. The hemispherical portion of the head 112 is arranged in the concave portion 103. In the concave portion 103, a distal end portion on the side of the cylinder 110 is smaller in diameter than the hemispherical portion. The concave portion 103 is formed such that the length of the slide rail 100 in the sliding direction is larger than the length of the hemispherical portion of the head 112. Thus, the slide rail 100 can be slightly moved in the sliding direction without expanding or contracting the rod 111 of the cylinder 110. For example, the slide rail 100 can be moved in the sliding direction between a position where the distal end of the head 112 makes contact with the bottom of the concave portion 103 and a position where the end portion 113 of the head 112 engages with the distal end portion of the concave portion 103.

The slide rail 100 slides as the rod 111 of the cylinder 110 expands and contracts. For example, when the cylinder 110 expands the rod 111 as shown in FIG. 7B, the head 112 hits the bottom of the concave portion 103. The head 112 pushes the slide rail 100 so that the slide rail 100 slides to the left. Furthermore, when the cylinder 110 contracts the rod 111 as shown in FIG. 7A, the end portion 113 of the head 112 engages with the distal end portion of the concave portion 103. The head 112 pulls the slide rail 100 so that the slide rail 100 slides to the right. In addition, the slide rail 100 is slid to the right by the weight of the test head 40, thereby making the same movement as the movement available when the head 112 pulls the slide rail 100.

Figure 9:
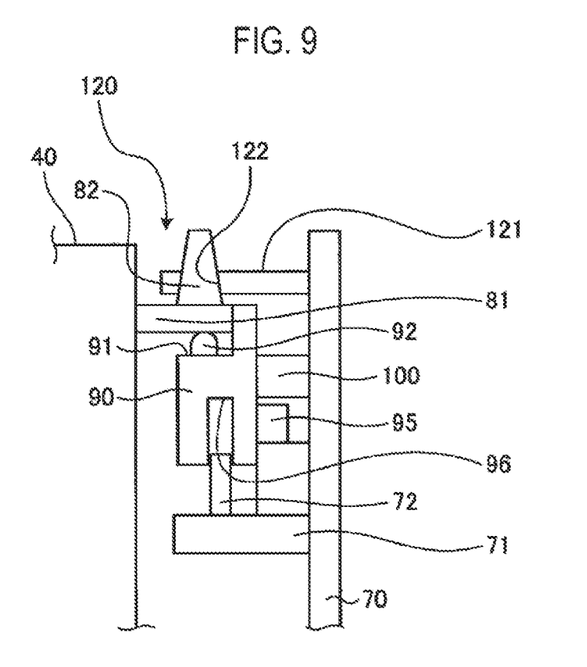
FIG. 9 is a schematic sectional view schematically showing an example of a configuration of a second frame and a slide rail according to the embodiment.

The second frame 90 is configured not to be slidable, but to be able to move up and down. FIG. 9 is a schematic sectional view schematically showing an example of the configuration of the second frame 90 and the slide rail 100 according to the embodiment. The support rail 71 is provided with a pin 72 below the second frame 90. The second frame 90 has a hole 96 formed on the lower surface thereof at a position corresponding to the pin 72. The pin 72 is inserted into the hole 96. As the pin 72 is inserted into the hole 96, the second frame 90 cannot slide, but can move up and down.

As shown in FIGS. 7A and 7B, the slide rail 100 slides as the rod 111 of the cylinder 110 expands and contracts. Even if the slide rail 100 slides, the second frame 90 does not slide because the pin 72 is inserted into the lower surface of the second frame 90. The cam follower 95 moves in the through-hole 101. The through-hole 101 is formed in an elongated shape obliquely with respect to the vertical direction. Therefore, as the cam follower 95 moves in the through-hole 101, the second frame 90 moves up and down. FIG. 7B shows a state in which the second frame 90 is moved up to the upper limit.

Since the test head 40 is supported by the second frame 90, it moves up and down as the second frame 90 moves up and down. The test head 40 can be switched between a fixed state in which the test head 40 is fixed to the first frame 70 and a movable state in which the test head 40 is movable. For example, as shown in FIG. 4, the first frame 70 is provided with a holder part 120 that limits the movable range of the test head 40 in a parallel direction.

Figure 10:
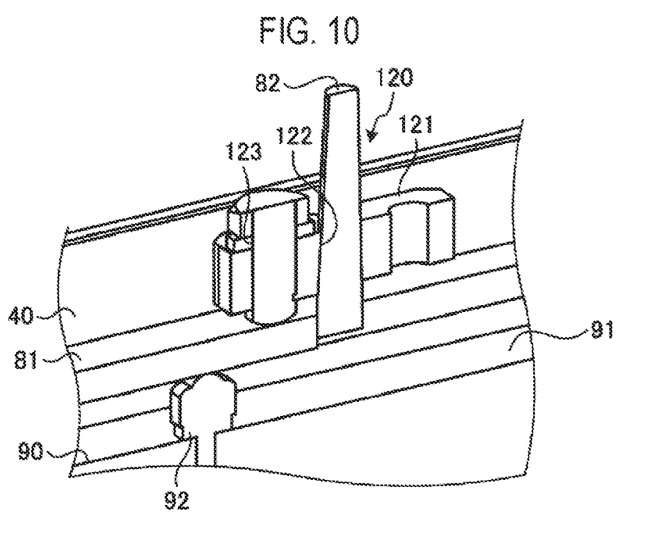
FIG. 10 is a sectional view showing an example of a configuration of a holder part according to the embodiment.

FIG. 10 is a sectional view showing an example of the configuration of the holder part 120 according to the embodiment. The support rail 81 is provided with a pin 82 facing upward. The pin 82 is formed such that the upper portion thereof is smaller in diameter than the lower portion thereof. In the present embodiment, the pin 82 has a tapered shape with the diameter thereof growing smaller toward the upper side. Alternatively, the pin 82 may have a constant diameter from the upper portion to the middle portion thereof, and may be thick only near the lower portion. The holder part 120 is provided with a holder 121. The holder 121 is fixed to the first frame 70. The holder 121 is provided with a pin 123 facing downward. The pin 123 is attached with the height thereof adjusted such that when the test head 40 is moved up to the upper limit as the second frame 90 is moved up and down, the pin 123 abuts against the support rail 81 to restraint the test head 40 from moving up beyond the upper limit. Furthermore, the holder 121 has a through-hole 122 formed at a position corresponding to the pin 82. The pin 82 extends through the through-hole 122. The diameter of the through-hole 122 is the same as the diameter of the lower portion of the pin 82. In the present embodiment, the through-hole 122 is formed in a tapered shape just like the shape of the lower portion of the pin 82. When the test head 40 is moved up to the upper limit, a gap between the pin 82 and the through-hole 122 disappears. When the test head 40 is moved down, the gap between the pin 82 and the through-hole 122 appears.

Since the support rail 81 is supported by the balls 92 of the second frame 90, the test head 40 can be moved in the horizontal direction within a range corresponding to the gap between the pin 82 and the through-hole 122.

Furthermore, the slide rail 100 can be slightly moved in the sliding direction without expanding or contracting the cylinder 110. When the slide rail 100 slides slightly, the cam followers 95 moves in the respective through-holes 101, and the second frame 90 moves up and down slightly. The test head 40 can be slightly moved up and down in a range corresponding to the range in which the slide rail 100 can slide, without expanding or contracting the cylinder 110.

Figure 11A:
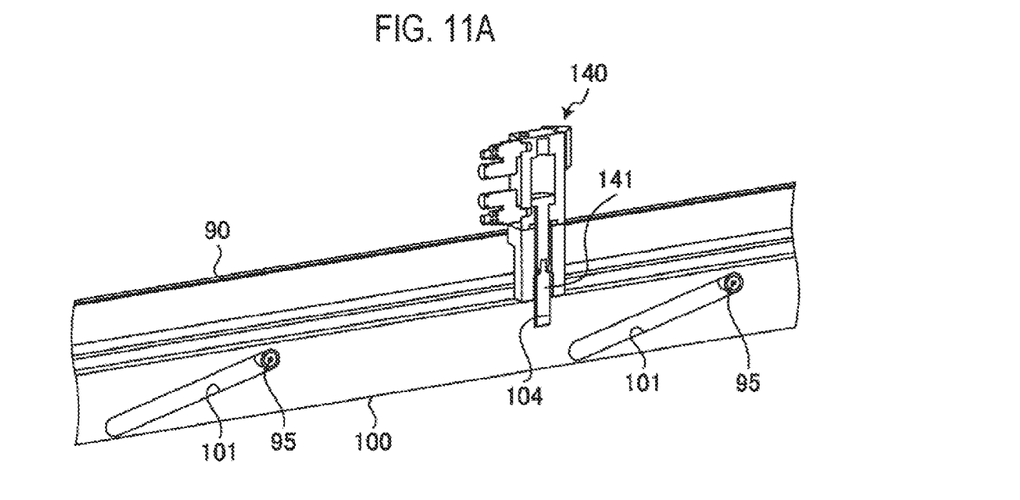
FIG. 11A is a view showing an example of a mechanism of a fixing part according to the embodiment.
Figure 11B:
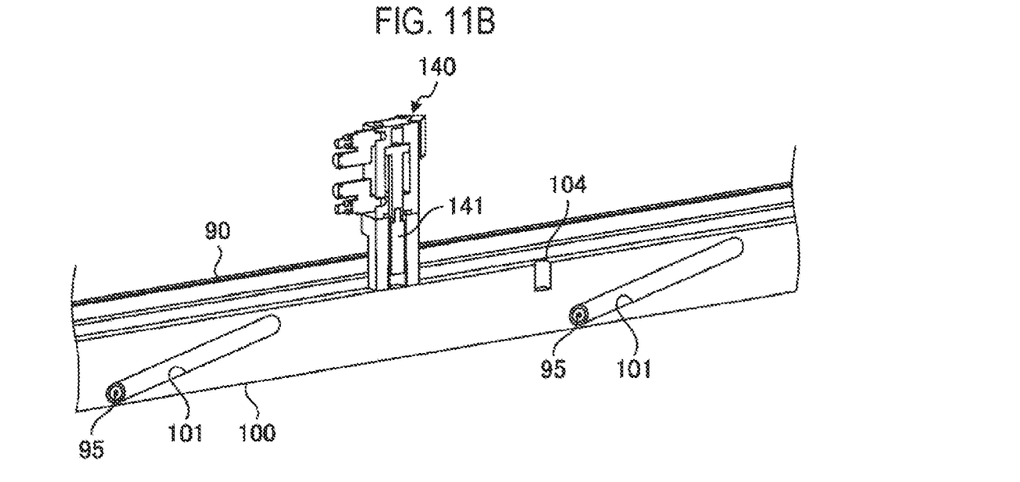
FIG. 11B is a view showing an example of the mechanism of the fixing part according to the embodiment.

In addition, the inspection apparatus 1 according to the embodiment includes a fixing part configured to fix the test head 40 to the first frame 70. FIGS. 11A and 11B are views showing an example of a mechanism of the fixing part according to the embodiment. The slide rail 100 has a hole 104 formed on the upper surface thereof. Moreover, a fixing part 140 is provided above the slide rail 100. The fixing part 140 is fixed to the first frame 70. The fixing part 140 includes a cylinder pin 141 provided so as to be able to move up and down. The fixing part 140 is provided at a position corresponding to the hole 104 when the slide rail 100 is slid and the second frame 90 is raised to the upper limit. By inserting the cylinder pin 141 of the fixing part 140 into the hole 104 with the second frame 90 raised to the upper limit, the slide rail 100 is fixed so as not to slide. By raising, the second frame 90 to the upper limit, the gap between the pin 82 and the through-hole 122 is eliminated, and the test head 40 is fixed to the first frame 70.

In the inspection apparatus 1, when the test head housing 5 is rotated by the hinge mechanism 7, the test head 40 is fixed to the first frame 70 by the fixing part 140. Accordingly, when rotating the test head housing 5, the inspection apparatus 1 can fix the test head 40 to the first frame 70.

On the other hand, when inspecting the semiconductor device, the inspection apparatus 1 causes the hinge mechanism 7 to arrange the test head housing 5 at the connection position where the test head housing 5 covers the upper portion of the insert ring 12. Then, the inspection apparatus 1 raises the cylinder pin 141 of the fixing part 140 to pull out the cylinder pin 141 from the hole 104, thereby releasing the fixing of the test head 40. Then, the inspection apparatus 1 connects the test head 40 to the insert ring 12 (the interface part).

Figure 12A:
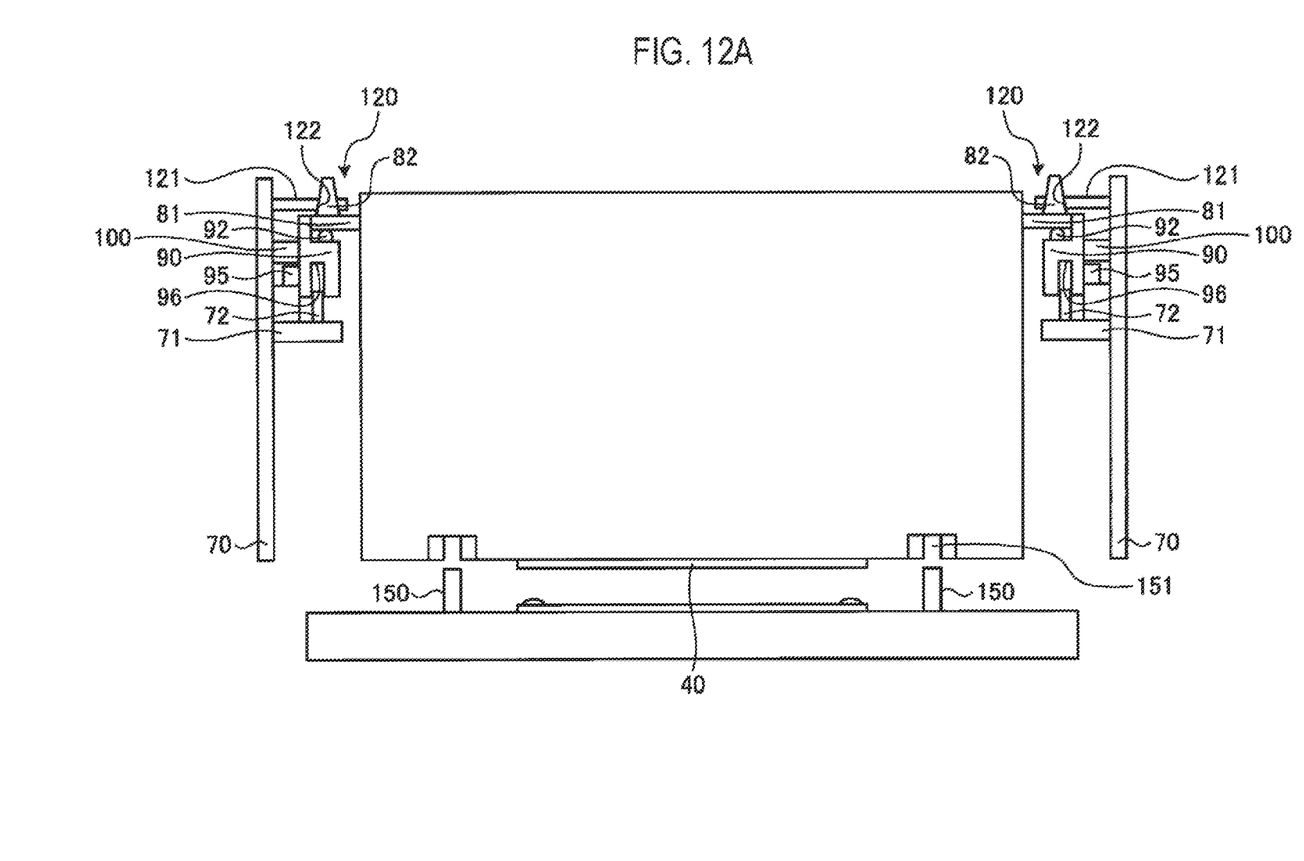
FIG. 12A is a view showing an example of a flow of connecting a test head to an insert ring.
Figure 12B:
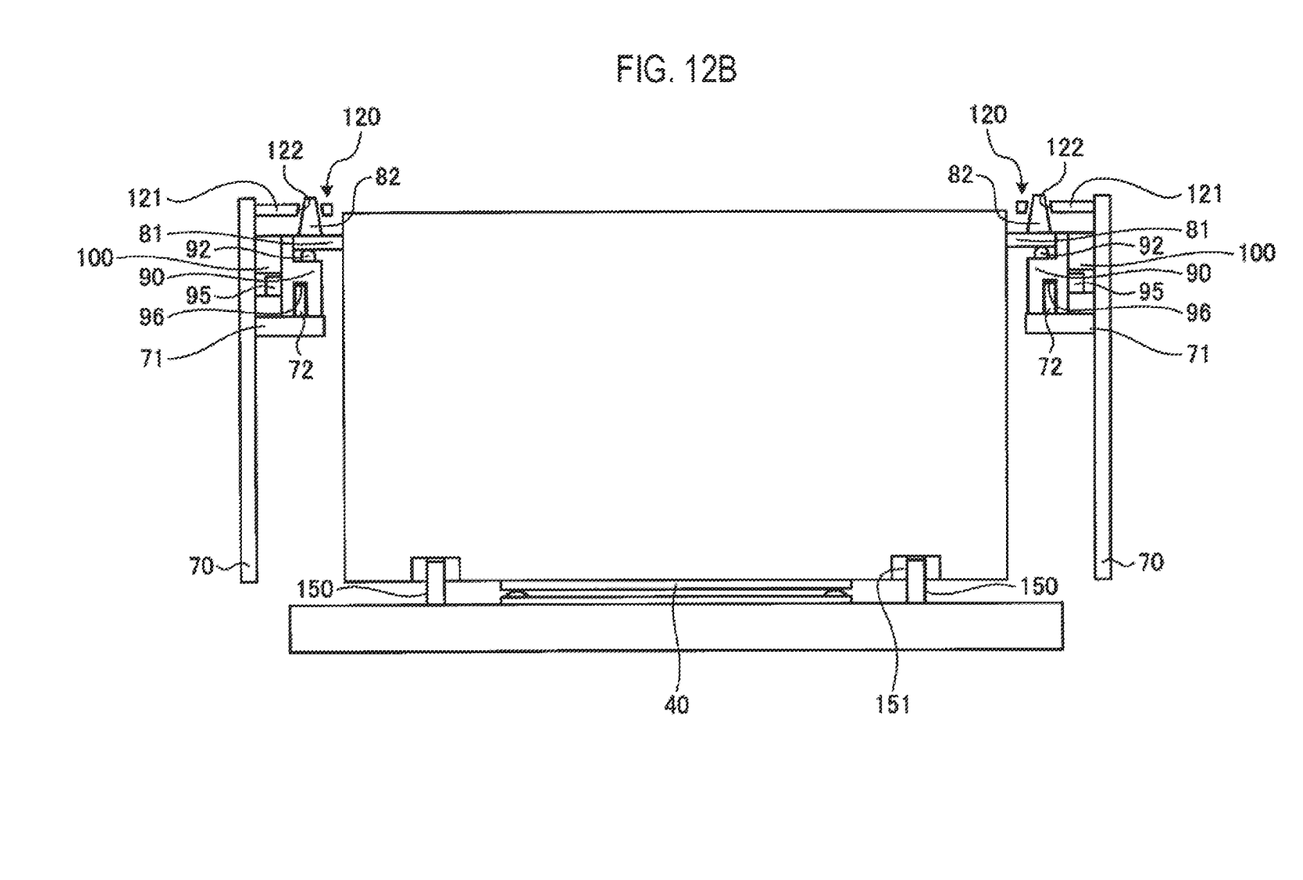
FIG. 12B is a view showing an example of the flow of connecting the test head to the insert ring.

FIGS. 12A and 12B are views schematically showing a flow of connecting the test head to the insert ring 12 (the interface part). FIG. 12A shows a state in which the test head housing 5 is arranged at a connection position where the test head housing 5 covers the upper portion of the insert ring 12. In FIG. 12A, the test head 40 is fixed in the horizontal direction because the second frame 90 is moved up to the upper limit so that no gap exists between the pin 82 and the through-hole 122.

The inspection apparatus 1 expands the rod 111 of the cylinder 110 and slides the slide rail 100 to lower the test head 40 to above the insert ring 12. FIG. 12B shows a state in Which the test head 40 is lowered. As the test head 40 is lowered, a gap is formed between the pin 82 and the through-hole 122. Thus, the test head 40 can move in the horizontal direction. Furthermore, by removing the cylinder pin 141 from the hole 104, the slide rail 100 can slightly move in the sliding direction without expanding or contracting the cylinder 110. Therefore, the test head 40 can also slightly move in the vertical direction.

On the upper surface of the insert ring 12, there are provided positioning pins 150 for guiding the test head 40 to the connection position where the test head 40 is connected to the insert ring 12. Furthermore, the test head 40 has holes 151 corresponding to the positioning pins 150.

The test head 40 is movable in the horizontal direction and the vertical direction. Thus, the test head 40 moves so that the positioning pins 150 are accommodated in the respective holes 151 when the test head 40 moves down. Therefore, the inspection apparatus 1 can arrange the test head 40 at the connection position where the test head 40 is connected to the insert ring 12. Since the test head 40 can be moved in the horizontal direction and the vertical direction, the position or posture of the test head 40 is changed according to the stress at which the test head 40 makes contact with the insert ring 12 or the pogo block 46 at the time of downward movement. The position or posture of the test head 40 is corrected such that the test head 40 is parallel to the insert ring 12. Thus, even when the test head 40 is inclined with respect to the insert ring 12, the position or posture of the test head 40 is corrected such that the test head 40 is parallel to the insert ring 12. Therefore, the inspection apparatus 1 can stably cause the test head 40 to be vacuum-sucked to the insert ring 12.

As described above, the inspection apparatus 1 according to the present embodiment includes the main body housing 2, the first frame 70 and the second frames 90. The main body housing 2 is provided on its upper surface with the interface part (the insert ring 12 and the pogo block 46) for electrical connection to the probe card 20, The first frame 70 is movable (rotatable) between the connection position where the first frame 70 covers the upper portion of the interface part and the retraction position where the first frame 70 is retracted from the upper portion of the interface part. The second frames 90 support the test head 40. The second frames 90 are disposed inside the first frame 70. The second frames 90 are held by the first frame 70 so as to be switchable between the fixed state in which the second frame 90 is fixed to the first frame 70 and the movable state in which the second frame 90 is movable at least in the horizontal direction with respect to the interface part at the connection position. Therefore, the inspection apparatus 1 can stably connect the test head 40 to the interface part.

Furthermore, the test head 40 is held by the first frame 70 so that in the movable state, the test head 40 is movable also in a direction perpendicular to the interface part at the connection position. Accordingly, even when the test head 40 is inclined with respect to the interface part, the inspection apparatus 1 can correct the position or posture of the test head 40 so that the test head 40 is parallel to the interface part, whereby the test head 40 can be stably connected to the interface part.

Furthermore, the test head 40 switches to the fixed state when the first frame 70 is rotated, and switches to the movable state when the test head 40 and the interface part are connected at the connection position. Accordingly, the inspection apparatus 1 can fix the test head 40 so that when rotating the first frame 70, the test head 40 is not moved with respect to the first frame 70. In addition, the inspection apparatus 1 connects the test head 40 and the interface part in the movable state unit, whereby the test head 40 can be stably connected to the interface part.

Furthermore, the interface part connects the test head 40 by vacuum suction. Therefore, the inspection apparatus 1 can bring the test head 40 into pressure contact with the interface part at an appropriate pressure.

Although the embodiment has been described above, it should be appreciated that the embodiment disclosed herein is illustrative in all respects and not restrictive. Indeed, the above-described embodiment can be realized in various forms. Moreover, the above-described embodiment may be omitted, replaced or modified in various forms without departing from the scope and spirit of the claims.

For example, in the above-described embodiment, there has been described the case where the interface part for connecting the probe card 20 is the insert ring 12 and the pogo block 46. However, the present disclosure is not limited thereto. The interface part may be any part as long as it can be electrically connected to the probe card.

Furthermore, in the above-described embodiment, there has been described the case where the test head 40 is connected to the insert ring 12 by vacuum suction. However, the present disclosure is not limited thereto. The test head 40 may be connected to the insert ring 12 by a manner other than the vacuum suction.

According to the present disclosure in some embodiments, it is possible to stably connect a test head to an interface part.

What is claimed is:

1. An inspection apparatus, comprising:
 a housing having an upper surface on which an interface part for electrical connection with a probe card is provided;
 a first frame configured to be movable to a connection position where the first frame covers an upper portion of the interface part and to a retraction position where the first frame is retracted from the upper portion of the interface part; and
 a second frame configured to support a test head, arranged inside the first frame, and held by the first frame so as to be switchable between a fixed state in which the second frame is fixed to the first frame and a movable state in which the second frame is movable at least in a direction parallel to the interface part at the connection position,
 wherein the test head switches to the fixed state when the first frame is moved while the test head and the interface part are not connected to each other, and switches to the movable state when the test head and the interface part are connected to each other at the connection position.

2. The apparatus of claim 1, wherein the test head is held by the first frame such that in the movable state, the test head is movable in a direction perpendicular to the interface part at the connection position.

3. The apparatus of claim 2, wherein the interface part is connected to the test head by a vacuum suction.

4. The apparatus of claim 1, wherein the interface part is connected to the test head by a vacuum suction.

* * * * *